(12) United States Patent
Guo (10) Patent No.: US 11,639,964 B2
(45) Date of Patent: May 2, 2023

(54) METHOD, APPARATUS AND STORAGE MEDIUM FOR TESTING CHIP, AND CHIP THEREOF

(71) Applicants: Beijing Baidu Netcom Science and Technology Co., Ltd., Beijing (CN); Kunlunxin Technology (Beijing) Company Limited, Beijing (CN)

(72) Inventor: Ziyu Guo, Beijing (CN)

(73) Assignees: Beijing Baidu Netcom Science and Technology Co., Ltd., Beijing (CN); Kunlunxin Technology (Beijing) Company Limited, Beijing (CN)

(*) Notice: Subject to any disclaimer, the term of this patent is extended or adjusted under 35 U.S.C. 154(b) by 0 days.

(21) Appl. No.: 17/213,672

(22) Filed: Mar. 26, 2021

(65) Prior Publication Data

US 2021/0215756 A1 Jul. 15, 2021

(30) Foreign Application Priority Data

Jul. 24, 2020 (CN) .......................... 202010725015.X (51) Int. Cl.
*G01R 31/3183* (2006.01)
*G01R 31/3185* (2006.01)
(Continued)

(52) U.S. Cl.
CPC ... *G01R 31/3183* (2013.01); *G01R 31/31926* (2013.01); *G01R 31/31935* (2013.01); *G01R 31/318552* (2013.01)

(58) Field of Classification Search
CPC ........ G01R 31/3183; G01R 31/318552; G01R 31/31926; G01R 31/31935;
(Continued)

(56) References Cited

U.S. PATENT DOCUMENTS 11,156,660 B1* 10/2021 Poplack ................ G06F 11/261
2005/0234674 A1 10/2005 Bundy et al.
(Continued)

FOREIGN PATENT DOCUMENTS

JP H6300814 A 10/1994
JP H991996 A 4/1997
(Continued)

OTHER PUBLICATIONS

R. Wu, J. Gerner, R. Weelus and K. Lew, "Testing logic-intensive memory ICs on memory testers," in IEEE Design & Test of Computers, vol. 14, No. 1, pp. 50-54, Jan.-Mar. 1997 (Year: 1997).*

*Primary Examiner* — Cynthia Britt
(74) *Attorney, Agent, or Firm* — The Webb Law Firm (57) ABSTRACT

A method and an apparatus for testing a chip, as well as a storage medium, and a chip thereof are provided. The chip includes an operation module. The method includes receiving, via a first pin of the chip, a test control signal indicating a test type of the operation module; performing a first test for the operation module using a first test vector based on the test type; or performing a second test for the operation module using a second test vector, where the first test is a test for the memory included in the operation module and the second test is a test for the functional logic in included in the operation module.

18 Claims, 6 Drawing Sheets

(51) Int. Cl.
*G01R 31/319* (2006.01)
*G01R 31/3193* (2006.01)

(58) Field of Classification Search
CPC ........ G01R 31/31917; G01R 31/31919; G01R 31/31813; G01R 31/3177; G01R 31/31718; G01R 31/31724; G01R 31/31727
See application file for complete search history.

(56) References Cited

U.S. PATENT DOCUMENTS

| | | | |
|---|---|---|---|
| 2006/0176745 A1* | 8/2006 | Eustis | G11C 29/48 365/201 |
| 2006/0282735 A1 | 12/2006 | Weinraub et al. | |
| 2008/0235498 A1 | 9/2008 | Yamada | |
| 2014/0115414 A1 | 4/2014 | Sul et al. | |
| 2021/0057036 A1* | 2/2021 | Khan | G01R 31/318522 |

FOREIGN PATENT DOCUMENTS

| | | |
|---|---|---|
| JP | H11223658 A | 8/1999 |
| JP | 200057002 A | 2/2000 |
| JP | 2001235524 A | 8/2001 |
| JP | 200422014 A | 1/2004 |
| JP | 2005332555 A | 12/2005 |
| JP | 2009283108 A | 12/2009 |
| JP | 2010204004 A | 9/2010 |
| JP | 2012234605 A | 11/2012 |

* cited by examiner

METHOD, APPARATUS AND STORAGE MEDIUM FOR TESTING CHIP, AND CHIP THEREOF

CROSS-REFERENCE TO RELATED APPLICATION

This application claims priority to Chinese Patent Application No. 202010725015.X filed Jul. 24, 2020, the disclosure of which is hereby incorporated by reference in its entirety.

BACKGROUND OF THE INVENTION

Field of the Invention

The present disclosure relates generally to the field of chips, and more particularly, to a method for testing a chip and to a testing chip. The present disclosure also relates to an electronic device for testing the chip and relates to a computer-readable storage medium.

Description of Related Art

In the field of artificial intelligence (AI) chips, it is necessary to test the chip to determine whether the internal structure of the chip is normal. During the test, it is necessary to input test vectors from the outside via the pins of the chip, and make the above determination upon the returned test result.

SUMMARY OF THE INVENTION

A method and an electronic device for testing a chip, as well as a computer readable storage medium and a corresponding testing chip, are provided in accordance with the present disclosure.

In a first aspect of the present disclosure, a method for testing a chip is provided. The chip comprises an operation module. The method includes receiving a test control signal indicating a test type of the operation module via a first pin of the chip; performing a "first test" for the operation module with a first test vector based on the test type indicated by the test control signal; or performing a "second test" for the operation module with a second test vector, wherein the "first test" is a test for the memory of the operation module and the "second test" is a test for the functional logic of the operation module.

In a second aspect of the present disclosure, a chip is provided. The chip includes an operation module, a first pin, and a controller. The first pin is coupled to the operation module and is configured to receive a test control signal indicating a test type of the operation module. The controller is coupled to the first pin and the operation module, and is configured to perform a "first test" for the operation module with a first test vector based on the test type indicated by the test control signal or to perform a "second test" for the operation module with a second test vector, wherein the "first test" is a test for the memory of the operation module and the "second test" is a test for the functional logic of the operation module.

In a third aspect of the present disclosure, there is provided an electronic device including one or more processors; and a memory for storing one or more programs that, when executed by one or more processors, cause the electronic device to implement the method according to the first aspect of the present disclosure.

In a fourth aspect of the present disclosure, there is provided a computer readable storage medium having a computer program stored thereon which, when executed by a processor, implements a method according to the first aspect of the present disclosure.

It is to be understood that the description in this section does not intend to identify key or critical features of the embodiments of the disclosure, nor does it intend to limit the scope of the disclosure. Other features of the present disclosure will become readily apparent from the following description.

BRIEF DESCRIPTION OF THE DRAWINGS

The above and other features, advantages and aspects of the present disclosure will become more apparent from the following detailed description when taken in conjunction with the accompanying drawings. It is to be understood that the drawings are for a better understanding of the present invention and are not to be construed as limiting the application. In the drawings, the same or similar figures labels denote the same or similar elements, wherein.

DESCRIPTION OF THE INVENTION

Exemplary embodiments of the present application are described below in connection with the accompanying drawings, in which various details of the embodiments of the present application are included to facilitate understanding, and are to be considered as exemplary only. Accordingly, one of ordinary skill in the art will recognize that various changes and modifications may be made to the embodiments described herein without departing from the scope and spirit of the present application. Also, for clarity and conciseness, descriptions of well-known functions and structures are omitted in the following description.

In the description of the embodiments of the present disclosure, the term "comprising" and its analogous terms are to be understood as open-ended, i.e., "including, but not limited to." The term "based on" is to be understood as "based at least in part on." The term "one embodiment" or "the embodiment" is to be understood as "at least one embodiment". The terms "first," "second" or the like may denote the same or different object; Other explicit and implicit definitions may also be included below.

As used herein, the term "chip" refers to a physical carrier implemented by any existing development of software or hardware and combinations thereof. In certain application scenarios, it includes, but is not limited to, "SoC", "crystal", "wafer", "bare wafer", "integrated circuit", "monolithic device", "semiconductor device", "microelectronic device", and the like.

As used herein, the term "operation module" refers to a module in a chip that implements certain functions or operations, which may be implemented by any existing development of software or hardware and combinations thereof. The operation module may include a plurality of operation units, for example, the operation module may include a plurality of operation units in the form of an array. The operation module can quickly perform complex and repetitive operations to meet the requirements of computing power by the AI algorithm.

As mentioned above, in the conventional scheme, the operation module in the chip is tested by introducing a test vector when the chip is tested. Testing the chip may include testing the memory included in the operation module in the chip and testing the functional logic included in the operation module. Conventional schemes do not distinguish these two test types. For example, if the test vector received by the chip is a test vector for testing the memory, the test vector is output to the operation module to complete the test for the memory. If the test vector received by the chip is a test vector for testing the functional logic, the test vector is output to the operation module to complete the test for the functional logic. Since the prior art cannot distinguish test types, it results in a relatively single type of test vector input into a certain pin.

The inventors note that the structure of an AI chip is relatively regular. On the one hand, the hierarchy of the AI chip is clear: an AI chip may include a plurality of operation modules, each of which includes a memory. On the other hand, each operation unit in the AI chip has high repeatability. By way of example only, an AI chip for image processing may include a plurality (e.g., six) of convolution operation modules having the same structural function. Further, each operation module may include a plurality of operation units having the same structure and function, and by way of example only, the convolution operation module may be an array of convolution operation units having a size 1024×512.

To address the problems of the prior art, the present disclosure proposes an improved solution for testing a chip. According to an embodiment of the present disclosure, an input test control signal indicating the type of a test of the operation module is input into the chip to select the type of the test. A test for the memory or a test for the functional logic is performed according to the determination of the test type. This makes it possible for the test vectors not to be limited to the tests performed, thereby making the types of the tests more diverse. Accordingly, the present disclosure provides a chip test scheme that is efficient and can reduce test costs.

Figure 1:
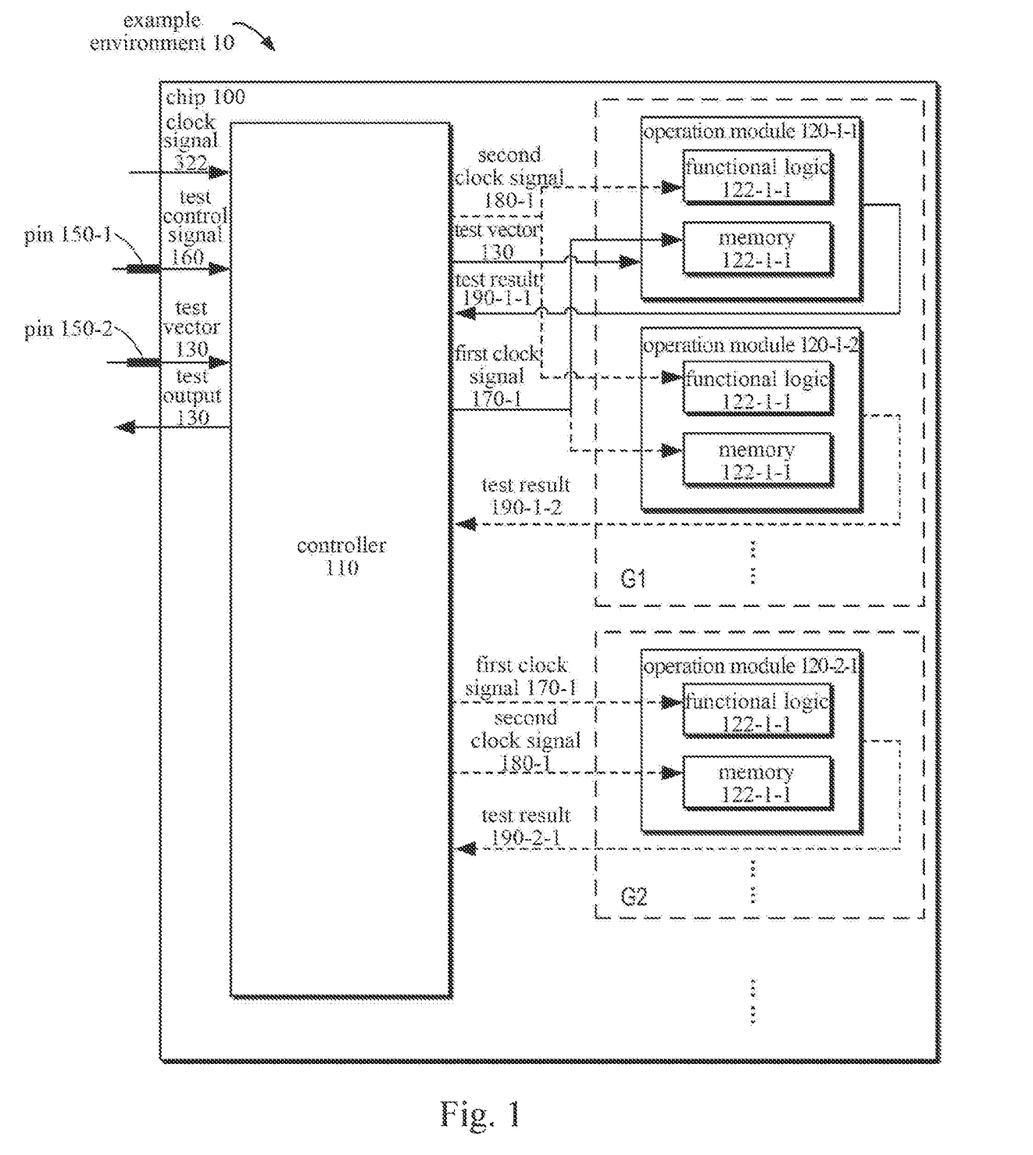
FIG. 1 illustrates a schematic diagram of an example environment in which a test scheme for a chip is implemented according to embodiments of the present disclosure.

Embodiments of the present disclosure will be described in detail below with reference to the accompanying drawings. FIG. 1 illustrates a schematic diagram of an example environment 10 in which various embodiments of the present disclosure may be implemented. The example environment 10 includes a chip 100. As shown in the figure, the chip 100 includes a controller 110 capable of executing the solution of the present disclosure and a plurality of operation modules 120-1-1, 120-1-2, 120-2-1, . . . . The first operation module 120-1-1, the second operation module 120-1-2, and the third operation module 120-2-1 are operation modules to be tested in the chip 100. For example, these operation modules may be convolution operation modules, displacement operation modules, and the like, which may be designed independently of each other.

These operation modules may be grouped according to certain criteria, which may be determined according to the needs of the user and the functions embodied by the chip 100. For example, some of the operation modules 120-1-1 and 120-1-2 that perform the same or similar functions, such as completing a convolution operation, may be grouped into a group. In some embodiments, operation modules having the same or similar structure may also be grouped into a group. It will be appreciated that the grouping criteria mentioned herein are exemplary and not restrictive, and that the particular grouping criteria is not limited thereto. Each operation module in the chip 100 is denoted by the reference numeral 120-$m$-$n$. The numeral m indicates that the operation module is divided into the m-th group, and the numeral n indicates that the operation module is the n-th operation module in the group. As shown, the operation modules 120-1-1, 120-1-2 are divided into the same group, in a different group as the operation module 120-2-1. It should be understood that the number of controller 110 and operation module 120 shown in FIG. 1 is merely exemplary and not limiting, and in other embodiments, the number of controller 110 and operation module 120 is any other value, and the present disclosure is not limited in this respect. It should also be understood that the number of operation module in each group shown herein is also illustrative only, and that the particular grouping situation is not limited by the illustrated embodiment. For ease of description, the plurality of operation modules 120-1-1, 120-1-2, 120-2-1 may be collectively referred to as operation module 120.

As shown in FIG. 1, an operation module 120-1-1 is used as an example to include a memory 124-1-1 and a function logic 122-1-1 in the operation module 120-1-1. When the chip 100 is tested, both the memory 124-1-1 and the functional logic 122-1-1 in the operation module 120-1-1 need to be tested. As shown, the numbering of the memories 124-$m$-$n$ and the functional logic 122-$m$-$n$ in the other operation modules is similar to the numbering of the operation module 120-$m$-$n$, and will not be repeated here.

In general, when a test for the chip 100 is performed, the chip 100 is placed on a test stand (not shown), and a test vector 130 is output from the test stand to complete the test. Still taking the operation module 120-1-1 as an example, the test vector 130 is inputted through the pin of the chip 100 and is inputted into the operation module 120-1-1 via the controller 110. The operation module 120-1-1 returns the test result 190-1-1 to the controller 110, which transmits the test output 140 of the test result of the plurality of operation modules back to the test stand. Thus, by comparing the received actual test result with the expected test result, the validity test result in the operation module 120-1-1 can be obtained, whereby it is determined whether the operation module 120-1-1 satisfies the design requirement.

Figure 2:
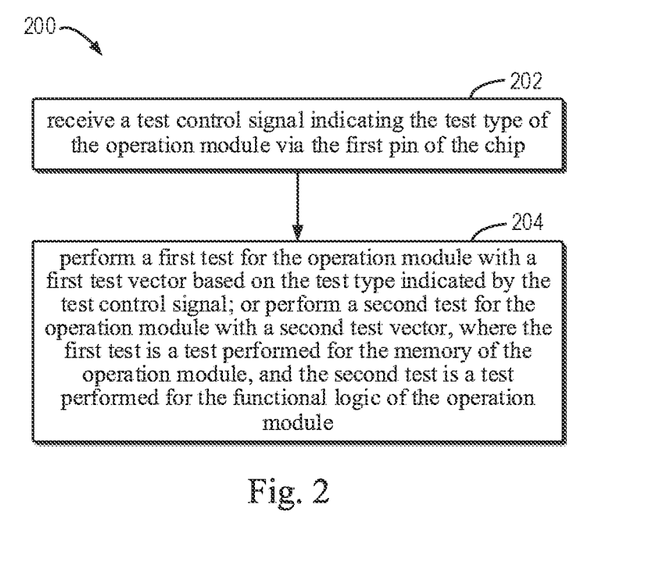
FIG. 2 illustrates a flow diagram of a test process for a chip according to embodiments of the present disclosure.

A test process for chip 100 according to the present disclosure will be described in more detail below with reference to FIG. 2. FIG. 2 illustrates a flow diagram of a process 200 for testing of a chip 100 in accordance with various example embodiments of the present disclosure. Process 200 may be implemented by controller 110 of FIG. 1. For ease of discussion, process 200 will be described with reference to FIG. 1 and primarily in connection with operation module 120-1-1 in chip 100.

At block 202, in conjunction with FIG. 1, the controller 110 receives a test control signal 160 from the first pin 150-1 of the chip 100, where the test control signal 160 is used to indicate the test type of the operation module 120-1-1. Specifically, the "test type" referred to herein indicates whether the test is performed for the memory 124-1-1 in the operation module 120-1-1 or on the functional logic 122-1-1 in the operation module 120-1-1. In the following description, the test performed for the memory 124-1-1 in the operation module 120-1-1 is referred to as a "first test", and the test performed for the functional logic 122-1-1 in the operation module 120-1-1 is referred to as a "second test."

Referring back to FIG. 2, at block 204, a test is performed based on the test type indicated by the test control signal 160. If it's a "first test" needed to be performed for the memory 124-1-1 of the operation module 120-1-1 based on the test type, the test for the memory is performed using the corresponding memory test vector, that is, the first test vector. Accordingly, if it's a "second test" needed to be performed for the functional logic 122-1-1 of the operation module 120-1-1 based on the test type, the test of the functional logic is performed using the corresponding functional logic test vector, that is, the second vector.

According to an embodiment of the present disclosure, the test vector 130 is selected using the test control signal 160 received from the first pin 150-1 of the chip 100. Depending on the type of test indicated by the test control signal 160, the test vector 130 may be passed to the corresponding operation module 120-1-1 for performing the "first test" for the memory 124-1-1 or the "second test" for the functional logic 122-1-1 in the operation module 120-1-1. Since selection of the test control signal 160 is achieved in the solutions of the present invention, there may be more types of input test vectors 130, rather than being limited to a particular test type. In this way, flexible switching of different test modes can be achieved.

With continued reference to FIG. 1, a test vector 130 for testing the memory 124-1-1 and the functional logic 122-1-1 of the operation module 120-1-1 in the chip 100 share a second pin 150-2 input. That is, the test vector 130 input via the second pin 150-2 of the chip 100 may be a vector for performing the "first test" for the memory 124-1-1 of the operation module 120-1-1 in the chip 100, and may also be a vector for performing the "second test" for the functional logic 122-1-1 of the operation module 120-1-1 in the chip 100. In other words, the memory 124-1-1 or the functional logic 122-1-1 in the operation module 120-1-1 may share a pin 150-2 to complete the test.

As described above, in the conventional scheme, it is necessary to provide a dedicated memory test pin to perform a test for the memory, meanwhile it is also necessary to provide a dedicated functional logic test pin to perform a test for the functional logic. In the embodiment according to the present disclosure, as long as the test vector 130 input via the same pin 150-2 is received, after a selection, the operation module 120-1-1 may complete a test for the memory 124-1-1 or a test for the functional logic 122-1-1 accordingly. Such an arrangement helps to reduce the increase in the number of pins due to testing, as compared to the conventional manner, thereby avoiding oversizing of the chip.

Referring back to FIG. 1, a test vector 130 is input to the operation module 120-1-1 to perform a corresponding test. It should be understood that this test vector 130 may be used to perform the "first test" for the memory 124-1-1 in the operation module 120-1-1, or may be used to perform the "second test" for the functional logic 122-1-1 in the operation module 120-1-1. No further distinguish is made here.

In some embodiments, the first pin 150-1 for receiving the test control signal 160 and the second pin 150-2 for receiving the test vector 130 may be the same pin on the chip 100. Such an arrangement helps to further reduce the number of pins of the chip 100.

In some embodiments, if the test type indicated by the test control signal 160 is the "first test", the first clock signal 170-1 is input to the operation module 120-1-1, and the "first test" is performed for the memory 124-1-1 in the operation module 120-1-1 using the first clock signal 170-1. Referring to FIG. 1, this process is illustrated by solid lines. Accordingly, if the test type indicated by the test control signal 160 is the "second test", the second clock signal 180-1 is input to the operation module 120-1-1, and the "second test" is performed for the functional logic 122-1-1 in the operation module 120-1-1 using the second clock signal 180-1. As described above, since only the case in which the test vector 130 performs the "first test" is shown in FIG. 1, this process of performing the test for the functional logic 122-1-1 in the operation module 120-1-1 is shown by a dashed line in the figure.

Referring back to FIG. 1, as mentioned above, the chip 100 may include a plurality of operation modules 120-1-1, 120-1-2, 120-2-1, and a corresponding memory and functional logic are included within each operation module. Based on a certain criteria, the operation modules are divided into one or more operation module groups. As shown, the operation modules 120-1-1, 120-1-2 are divided into one operation module group G1. Similarly, another operation module group G2 may be formed.

In some embodiments, the criterion may be that each of the operation modules 120-1-1, 120-1-2 in the operation module group G1 has the same or similar attribution or functional logic. It is to be understood that "identical" as used herein does not require a completely identical or strictly identical. In some embodiments, the criteria may also be an attribution such as position, type, size, clock frequency or the like of the operation modules 120-1-1, 120-1-2. In alternative embodiments, these criterias may also be functional logic such as test requirements or the like of the operation modules 120-1-1, 120-1-2. For example, if the criterion is the functional logic of the operation modules 120-1-1, 120-1-2, some operation modules having the same or similar functional logic to perform a task together (for example, to perform a convolution operation) may be selected as a group. Selecting and testing, in parallel, the operation modules in according to this criterion help to simplify wiring in the chip 100, thereby reducing the cost of the chip 100 and reducing the failure rate. Therefore, the design of the test vector 130 may be simplified according to the same or similar test requirements as a criterion for selection.

By grouping the operation modules, characteristics belonging to the same or similar properties and functions between the operation modules can be fully utilized. As a result, the test efficiency of the chip 100 can be optimized. Only a few illustrative criteria are set forth herein. It will be appreciated that the corresponding criteria may be selected in accordance with the needs of the user and the specific configuration of the chip 100, such embodiments falling within the scope of the present invention.

For brevity, only the case where the operation module group G1 includes two operation modules 120-1-1, 120-1-2 is shown, and only two operation module groups G1, G2 are shown. Of course, each operation module group G1, G2 may also include more operation modules, and may also include more operation module groups in the chip 100. More exemplary implementations according to embodiments of the present disclosure are described below primarily in connection with the operation module group G1.

Since the operation modules 120-1-1, 120-1-2 within the operation module group G1 have the same or similar characteristics, the test vector 130 thereof is the same. Therefore, grouping these operation modules 120-1-1, 120-1-2 into one group helps to share the pin of the chip 100, thereby further reducing the increase in the number of pins caused by the test.

As shown in FIG. 1, when the test vector 130 is input to the controller 110 of the chip 100, the controller 110 outputs a first clock signal 170-1 or a second clock signal 180-1 based on the test control signal 160. The first clock signal 170-1 is adapted to perform a "first test" for the memory included in each of the operation modules 120-1-1, 120-1-2 in the operation module group G1, and the second clock signal 180-1 is adapted to perform a "second test" for the functional logic included in each of the operation modules 120-1-1, 120-1-2 in the operation module group G1. Test vector 130 may be input to memory 124-1-2 and functional logic 122-1-2 in operation module 120-1-2. The process of performing a test for the memory 124-1-2 and the function logic 122-1-2 in the operation module 120-1-2 is also shown in FIG. 1 by dashed lines, and the corresponding test result 190-1-2 may be output back to the controller 110 for determining whether the operation module 120-1-2 satisfies the design requirement.

A similar operation may be performed for another operation module group G2 in the chip 100. Referring to FIG. 1, a first clock signal 170-2 may be input to a corresponding operation module 120-2-1 of the operation module group G2 for performing the "first test" for the memory 124-2-1. The second clock signal 180-2 may also be input to a corresponding operation module 120-2-1 of the operation module group G2 for performing the "second test" for the functional logic 122-2-1.

Figure 3:
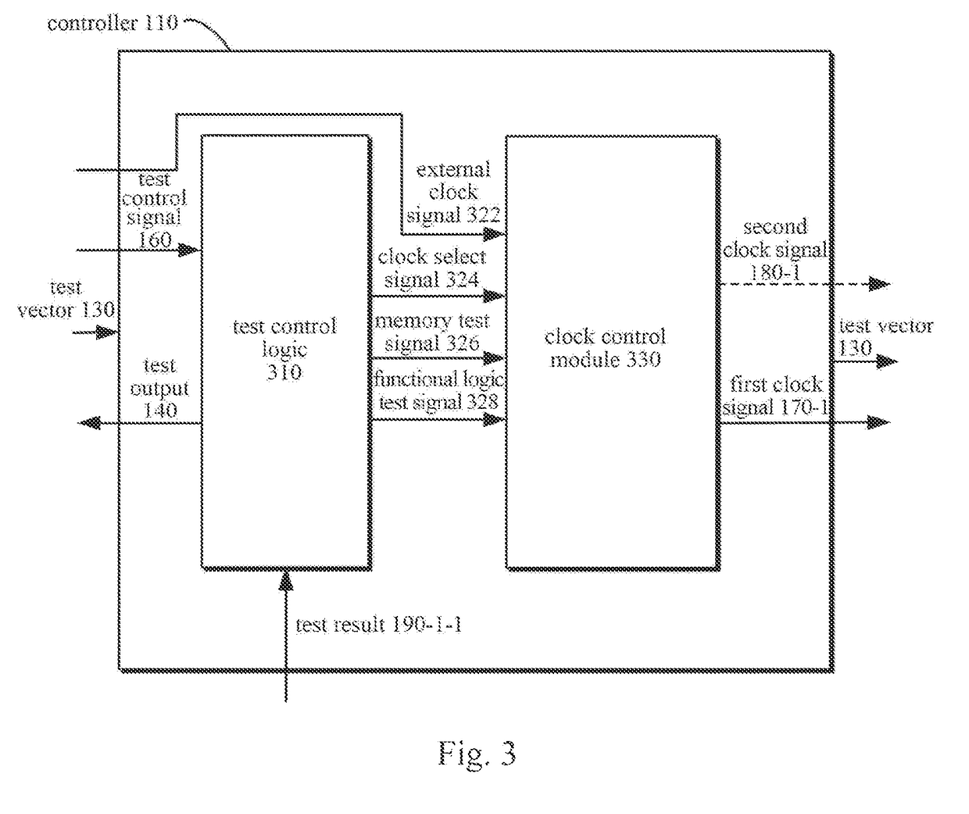
FIG. 3 illustrates a schematic diagram of a controller according to embodiments of the present disclosure.

Some implementations of the controller 110 according to embodiments of the present disclosure are described below with reference to FIG. 3. The controller 110 includes a test control logic 310 and a clock control module 330. As shown, the test control logic 310 is configured to output a memory test signal 326 to a clock control module 330 in response to a test type being the "first test"; and output a functional logic test signal 328 to the clock control module 330 in response to the test type being the "second test".

the clock control module 330 is configured to input the first clock signal 170-1 to the operation module 120-1-1 in response to receiving the functional logic test signal 328 from the test control logic 310; and input the second clock signal 180-1 to the operation module 120-1-1 in response to receiving the memory test signal 326 from the test control logic 310.

In some embodiments, the clock control module 330 is further configured to receive an external clock signal 322 or to generate an internal clock signal. The first clock signal 170-1 may be an external clock signal 322 or an internal clock signal of the chip 100, and the second clock signal 180-1 may be an internal clock signal of the chip 100.

In some embodiments, test control logic 310 is further configured to generate the clock select signal 324 and output the clock select signal 324 to the clock control module 330. The clock select signal 324 is used to instruct the clock control module 330 to select an internal clock signal or an external clock signal 322.

Figure 4:
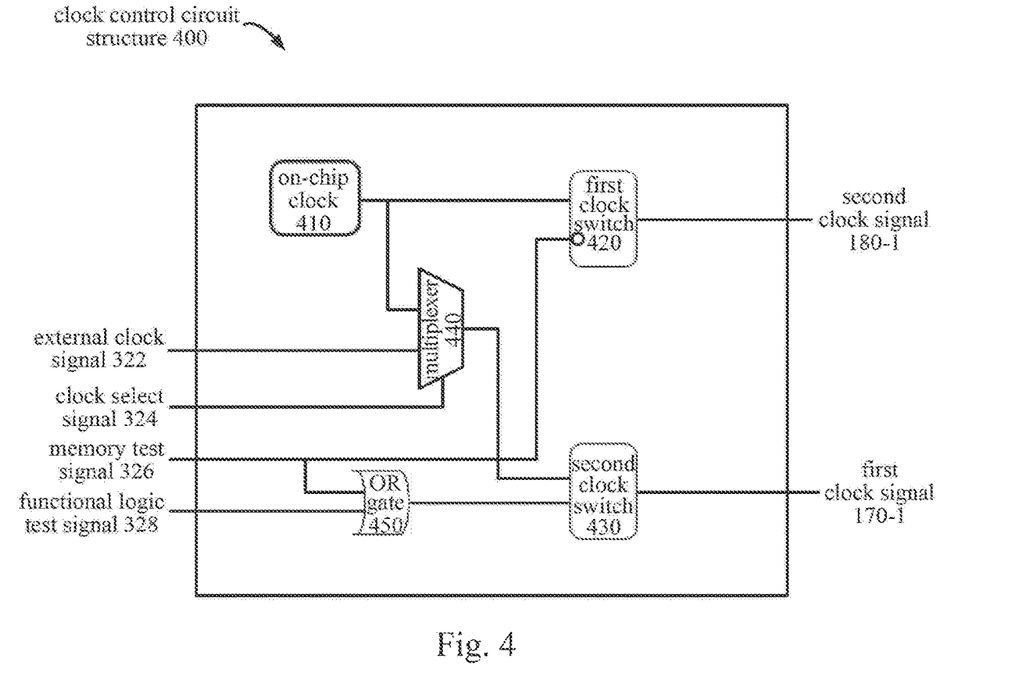
FIGS. 4 to 5 illustrate schematic diagrams of a clock control circuit structure for a chip according to embodiments of the present disclosure, respectively.
Figure 5:
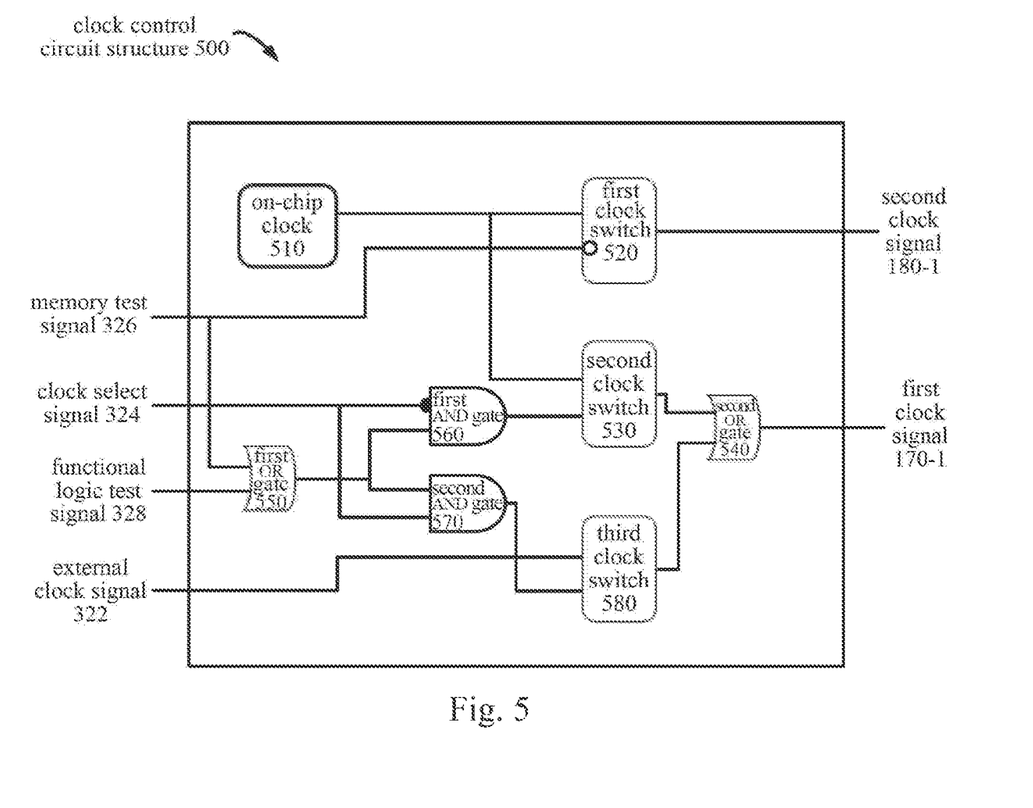

FIG. 4 illustrates a schematic diagram of a clock control circuit structure 400 according to embodiments of the present disclosure, while FIG. 5 illustrates a schematic diagram of a clock control circuit structure 500 according to embodiments of the present disclosure. The clock control circuit structures 400, 500 may be internal circuit structures of the clock control module 330 of the controller 110.

As shown in FIG. 4, the clock control circuit structure 400 includes an on-chip clock 410 for generating an internal clock signal and outputting the internal clock signal to the first input end of the multiplexer 440 and the first input end of the first clock switch 420. The clock control circuit structure 400 further includes a multiplexer 440 having a first input end coupled to an output end of the on-chip clock 410 to receive an internal clock signal from the on-chip clock 410, a second input end configured to receive an external clock signal 322, wherein the multiplexer 440 is configured to, based on the clock select signal 324 from the test control logic 310, select the internal clock signal to be output or external clock signal 322 to be output, and an output end of the multiplexer 440 is coupled to the first input end of the second clock switch 430.

The clock control circuit structure 400 further includes an OR gate 450, wherein a first input end of the OR gate 450 is configured to receive a memory test signal 326 from the test control logic 310, and a second input end of the OR gate 450 is configured to receive a functional logic test signal 328 from the test control logic 310, or an output end of the OR gate 450 is coupled to a second input end of the second clock switch 430.

The clock control circuit structure 400 further includes a first clock switch 420 having a first input end coupled to an output end of the on-chip clock 410 to receive an internal clock signal from the on-chip clock 410, a second input end configured to receive a reverse signal from the memory test signal 326 of the test control logic 310, and an output end configured to output a second clock signal 180-1 for performing the "second test".

The clock control circuit structure 400 further includes a second clock switch 430 having a first input end coupled to an output end of the multiplexer 440, a second input end coupled to an output end of the OR gate 450, and an output end configured to output a first clock signal 170-1 for performing the "first test".

As shown in FIG. 5, the clock control circuit structure 500 may include an on-chip clock 510 for generating an internal clock signal and outputting the internal clock signal to a first input end of a first clock switch 520 and a first input end of a second clock switch 530.

The clock control circuit structure 500 further includes a first OR gate 550 having a first input end configured to receive a memory test signal 326 from the test control logic 310, a second input end configured to receive a functional logic test signal 328 from the test control logic 310, and an output end coupled to a second input end of the first AND gate 560 and a first input end of the second AND gate 570.

The clock control circuit structure 500 further includes a first AND gate 560, a first input end of which is configured to receive an reverse signal from the clock select signal 324 of the test control logic 310, and an output end of which is coupled to a second input end of the second clock switch 530.

The clock control circuit structure 500 further includes a second AND gate 570, a second input end of which is configured to receive a clock select signal 324 from the test control logic 310, and an output end of which is coupled to a second input end of the third clock switch 580.

The clock control circuit structure 500 further includes a first clock switch 520 having a second input end configured to receive a reverse signal from the memory test signal 326 of the test control logic 310, and an output end configured to output a second clock signal 180-1 for performing a second test.

The clock control circuit structure 500 further includes a second clock switch 530 having an output end coupled to a first input end of the second OR gate 540 and a third clock switch 580 having a first input end configured to receive an external clock signal 322 from the test control logic 310 and having an output end coupled to a second input end of the second OR gate 540.

The clock control circuit structure 500 also includes a second OR gate 540 whose output end is configured to output a first clock signal 170-1 for performing the "first test".

It will be appreciated that the clock control circuit structures 400 and 500 shown herein are merely illustrative and not limiting, and other forms of control circuit structures may be employed to perform control of signals in other embodiments, and the present disclosure is not limited in this respect.

In some embodiments, the controller 110 may also determine the operation modules in operation module 120, which do not need to be tested. By closing the clocks of these operation modules that do not need to be tested, the test power consumption of the chip 100 may be effectively reduced, thereby reducing the test cost.

In some embodiments, the memory 124-1-1 and the functional logic 122-1-1 in the operation module 120-1-1 may be reset by inputting a corresponding reset signal to the operation module 120-1-1 prior to testing the memory 124-1-1 or the functional logic 122-1-1. The memory 124-1-1 or the functional logic 122-1-1 may be reset independently. Specifically, the controller 110 may receive a reset control signal indicating a reset type. As used herein, "reset type" means whether the reset is to reset the memory 124-1-1 in the operation module 120-1-1 or to reset the functional logic 122-1-1 in the operation module 120-1-1. In some embodiments, in response to determining that the reset type indicates a reset of the memory 124-1-1 in the operation module 120-1-1, a first reset signal is input to the operation module 120-1-1 to reset the memory 124-1-1 of the operation module 120-1-1 prior to performing the "first test". In an alternative embodiment, in response to determining that the reset type indicates a reset of the functional logic 122-1-1 in the operation module 120-1-1, a second reset signal is input to the operation module 120-1-1 to reset the functional logic 122-1-1 of the operation module 120-1-1 prior to performing the "second test". By such an arrangement, flexible reset control of the memory 124-1-1 and the functional logic 122-1-1 in the chip 100 may be conveniently realized.

It should be understood that the operation module 120-1-1 are described herein just for reference, these descriptions may apply equally to other operation modules 120-1-2, 120-2-1 or the like in the chip 100.

Returning to FIG. 1, the test vector 130 may be input through pin 150-2 of chip 100. In some embodiments, the test vector 130 and the test output 140 may be interacted between the controller 110 and the operation module 120 by wired or wireless communication. It should also be understood that the test vector 130 and the test output 140 may be transmitted between controller 110 and operation module 120 through one or more interactions depending on the particular application scenario, and the present disclosure is not limited in this respect.

It will be appreciated that any existing method may be used to design the particular test vector 130. It should also be understood that any existing wiring scheme may be employed in performing the wiring of the test of the chip 100, and the present disclosure is not limited in this respect.

According to the embodiment of the present disclosure, unlike the conventional chip test method, by selecting the test type in the chip 100 so that test vectors are input into the same pin of the chip, the present invention helps to reduce the number of pins of the chip 100, thereby also avoiding oversizing of the chip 100. In addition, the operation modules having the same or similar characteristics are grouped and the operation modules within the groups are tested in parallel, such an arrangement may increase the speed at which the chip 100 is tested. In addition, the solution according to the present application may also effectively reduce the cost of testing the chip 100 by closing the idle operation module.

Figure 6:
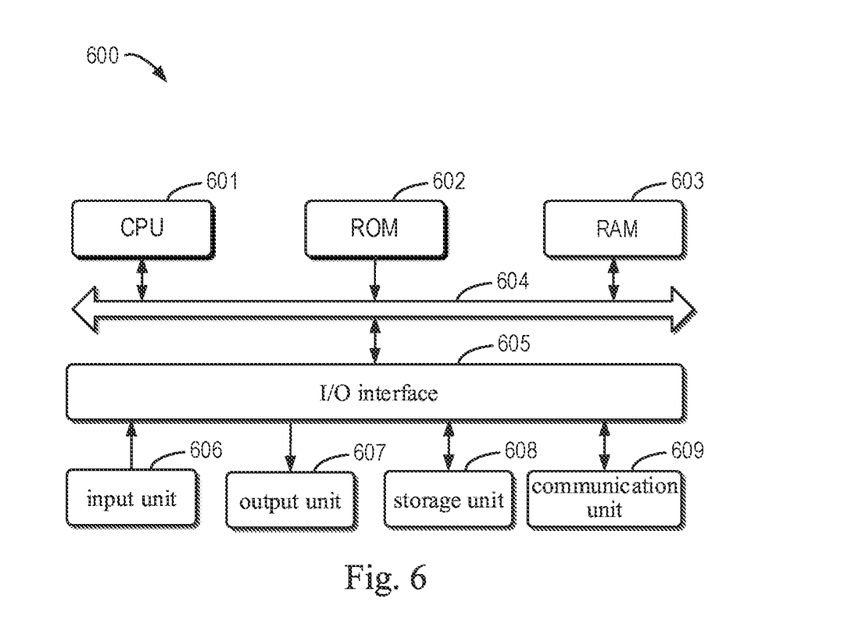
FIG. 6 illustrates a schematic block diagram of an electronic device capable of implementing the embodiments of the present disclosure.

According to embodiments of the present application, the present application also provides an electronic device and a readable storage medium. FIG. 6 shows a schematic block diagram of an electronic device 600 capable of implementing various embodiments of the present disclosure.

As shown, the electronic device 600 includes a Central Processing Unit (CPU) 601, which may perform various appropriate actions and processes according to computer program instructions stored in a Read Only Memory (ROM) 602 or computer program instructions loaded into a Random Access Memory (RAM) 603 from a storage unit 608. In RAM 603, various programs and data required for operation of the electronic device 600 may also be stored. The CPU 601, ROM 602, and RAM 603 are connected to each other via bus 604. An Input/Output (I/O) interface 605 is also connected to bus 604.

A plurality of components in the electronic device 600 are connected to the I/O interface 605, including an input unit 606, such as a keyboard, a mouse, and the like; an output unit 607, for example, various types of displays, speakers, and the like; a storage unit 608, such as a magnetic disk, an optical disk, or the like; and a communication unit 609, such as a network card, a modem, or a wireless communication transceiver. The communication unit 609 allows the electronic device 600 to exchange information/data with other devices over a computer network such as the Internet and/or various telecommunications networks.

The various processes and processes described above, such as method 200, may be performed by processing unit 601. For example, in some embodiments, method 200 may be implemented as a computer software program tangibly embodied in a machine-readable medium, such as storage unit 608. In some embodiments, part or all of the computer program may be loaded and/or installed on the electronic device 600 via the ROM 602 and/or the communication unit 609. When the computer program is loaded into the RAM 603 and executed by the CPU 601, one or more actions of the method 200 described above may be performed.

The present disclosure may be a method, apparatus, system, and/or computer program product. The computer program product may include a computer readable storage medium having computer readable program instructions embodied thereon for performing various aspects of the present disclosure.

The computer-readable storage medium may be a tangible device that may hold and store instructions for use by the instruction execution device. The computer-readable storage medium may be, for example, but not limited to, an electrical storage device, a magnetic storage device, an optical storage device, an electromagnetic storage device, a semiconductor storage device, or any suitable combination of the foregoing. More specific examples (non-exhaustive lists) of the computer-readable storage medium include: a portable computer disk, a hard disk, a Random Access Memory (RAM), a Read Only Memory (ROM), an Erasable Programmable Read Only Memory (EPROM or flash memory), a Static Random Access Memory (SRAM), a portable Compact Disk Read Only Memory (CD-ROM), a Digital Versatile Disk (DVD), a memory stick, a floppy disk, a mechanical encoding device, e.g., a punch card or in-groove bump structure on which instructions are stored, and any suitable combination of the foregoing. As used herein, a computer-readable storage medium is not to be construed as an instantaneous signal itself, such as a radio wave or other freely propagating electromagnetic wave, an electromagnetic wave propagating through a waveguide or other transmission medium (e.g., an optical pulse through a fiber optic cable), or an electrical signal transmitted through a wire.

The computer readable program instructions described herein may be downloaded from a computer readable storage medium to various computing/processing devices, or via a network, such as the Internet, a local area network, a wide area network, and/or a wireless network, to an external computer or external storage device. The network may include copper transmission cables, fiber optic transmission, wireless transmission, routers, firewalls, switches, gateway computers, and/or edge servers. A network adapter card or network interface in each computing/processing device receives computer readable program instructions from the network and forwards the computer readable program instructions for storage in a computer readable storage medium in the respective computing/processing device.

The computer program instructions used to perform the operations of the present disclosure may be assembly instructions, Instruction Set Architecture (ISA) instructions, machine instructions, machine-related instructions, microcode, firmware instructions, state setting data, or source code or object code written in any combination of one or more programming languages, including object-oriented programming languages such as Smalltalk, C++, and the like, and conventional procedural programming languages such as C language or similar programming languages. The computer readable program instructions may be executed entirely on the user computer, partly on the user computer, as a separate software package, partly on the user computer partly on the remote computer, or entirely on the remote computer or server. In the case of a remote computer, the remote computer may be connected to the user computer through any kind of network, including a Local Area Network (LAN) or a Wide Area Network (WAN), or may be connected to an external computer (e.g., connected through the Internet using an Internet service provider). In some embodiments, various aspects of the present disclosure are implemented by personalizing electronic circuits, such as programmable logic circuits, field programmable gate arrays (FPGA), or programmable logic arrays (PLA), capable of performing computer readable program instructions with the status information of the computer-readable program instructions.

Various aspects of the present disclosure are described herein with reference to flow charts and/or block diagrams of methods, apparatus (systems), and computer program products in accordance with embodiments of the present disclosure. It should be understood that each block of the flowcharts and/or block diagrams, and combinations of blocks in the flowcharts and/or block diagrams, may be implemented by computer readable program instructions.

The computer readable program instructions may be provided to a processing unit of a general purpose computer, special purpose computer, or other programmable data processing apparatus to produce a machine such that the instructions, when executed by the processing unit of the computer or other programmable data processing apparatus, produce means for implementing the functions/acts specified one or more blocks in the flowchart and/or in the block diagrams. The computer-readable program instructions may also be stored in a computer-readable storage medium that cause a computer, programmable data processing apparatus, and/or other device to operate in a particular manner, such that the computer-readable medium having the instructions stored thereon includes an article of manufacture that includes instructions that implement various aspects of the functions/acts specified one or more block in the flowchart and/or block diagram.

Computer readable program instructions may also be loaded onto a computer, other programmable data processing apparatus, or other device such that a series of operational steps are performed for the computer, other programmable data processing apparatus, or other device to produce a computer-implemented process such that the instructions that execute on the computer, other programmable data processing apparatus, or other device implement the functions/actions specified in one or more block of the flowcharts and/or block diagrams.

The flowcharts and block diagrams in the drawings illustrate architectures, functions, and operations of possible implementations of systems, methods, and computer program products in accordance with various embodiments of the present disclosure. In this regard, each block in a flowchart or block diagram may represent a module, program segment, or portion of an instruction that contains one or more executable instructions for implementing a specified logical function. In some alternative implementations, the functions noted in the blocks may also occur in an order different from that noted in the drawings. For example, two successive blocks may actually be executed substantially in parallel, and they may sometimes be executed in the reverse order, depending on the functionality involved. It is also noted that each block of the block diagrams and/or flowcharts, and combinations of blocks in the block diagrams and/or flowcharts, may be implemented with a dedicated hardware-based system that performs the specified functions or actions, or may be implemented with a combination of dedicated hardware and computer instructions.

It is to be understood that the steps may be reordered, added or deleted by using the various forms pf process shown above. For example, the steps described in the present application may be performed in parallel or sequentially or in a different order, so long as the desired results of the technical solution disclosed in the present application can be realized, and no limitation is imposed herein.

The foregoing detailed description is not intended to limit the scope of the present invention. It will be appreciated by those skilled in the art that various modifications, combinations, sub-combinations, and substitutions may be made depending on design requirements and other factors. Any modifications, equivalents, and improvements that fall within the spirit and principles of this application are intended to be included within the scope of this application.

What is claimed is:

1. A method for testing a chip, the chip comprising an operation module and a controller, the method comprising:
   receiving a test control signal indicating a test type of the operation module via a first pin of the chip; and
   performing, based on the test type and by the controller, a first test of the operation module with a first test vector from outside of the chip via a second pin of the chip, or
   performing, based on the test type and by the controller, a second test of the operation module with a second test vector from outside of the chip via the second pin of the chip, wherein the first test is a test performed for a memory included in the operation module, and the second test is a test performed for a functional logic included in the operation module.

2. The method of claim 1, wherein the first pin and the second pin are the same pin of the chip.

3. The method of claim 1, further comprising:
inputting a first clock signal into the operation module in response to the test control signal indicating that the test type is a first test; and
performing the first test of the operation module using the first clock signal;
or
inputting a second clock signal into the operation module in response to the test control signal indicating that the test type is a second test; and
performing the second test of the operation module using the second clock signal.

4. The method of claim 3, wherein the first clock signal is an external clock signal or an internal clock signal of the chip, and the second clock signal is the internal clock signal of the chip.

5. The method of claim 1, wherein the chip comprises a plurality of operation modules, and the method further comprises:
dividing more than two of the plurality of operation modules into one or more operation module groups according to a criterion,
wherein performing the first test comprises testing the memory included in each operation module in the operation module group;
or
performing the second test comprises testing the functional logic included in each operation module in the operation module group.

6. The method of claim 5, wherein the criterion is that each operation module in the operation module group has the same attribution or functional logic.

7. The method of claim 1, further comprising:
receiving a reset control signal indicating a reset type;
inputting, based on the received reset type, a first reset signal to the operation module to reset the memory before performing the first test; or
inputting, based on the received reset type, a second reset signal to the operation module to reset the functional logic before performing the second test.

8. The method of claim 1, wherein the chip comprises a plurality of operation modules, and the method further comprises:
determining, from the plurality of operation modules, an operation module that does not need to be tested; and
closing the clock of the determined operation module.

9. A non-transitory computer readable storage medium storing a computer program which, when executed by a processor, causes the processor to implement the method according to claim 1.

10. A chip comprising:
an operation module;
a first pin coupled to the operation module and configured to receive a test control signal indicating a test type of the operation module; and
a controller coupled to the first pin and the operation module, and configured to perform a first test of the operation module with a first test vector based on the test type from outside of the chip via a second pin of the chip, or to perform a second test of the operation module with a second test vector from outside of the chip via the second pin of the chip;
wherein the first test is a test performed for a memory included in the operation module and the second test is a test performed for a functional logic included in the operation module.

11. The chip of claim 10, wherein the first pin and the second pin are the same pin of the chip.

12. The chip of claim 10, wherein the controller comprises:
a test control logic configured to:
output a memory test signal to a clock control module in response to the test type being the first test; and
output a functional logic test signal to the clock control module in response to the test type being the second test; and
the clock control module is configured to:
input a first clock signal to the operation module in response to receiving the functional logic test signal from the test control logic; and
input a second clock signal to the operation module in response to receiving the memory test signal from the test control logic.

13. The chip of claim 12,
wherein the clock control module is further configured to receive an external clock signal or to generate an internal clock signal; and
wherein the first clock signal is an external clock signal or an internal clock signal of the chip, and the second clock signal is the internal clock signal of the chip.

14. The chip of claim 13, wherein the test control logic is further configured to:
generate a clock selection signal, and output the clock selection signal to the clock control module, the clock selection signal instructing the clock control module to select the internal clock signal or the external clock signal.

15. The chip of claim 14, wherein the clock control module comprises:
an on-chip clock for generating the internal clock signal and outputting the internal clock signal to a first input end of a multiplexer and a first input end of a first clock switch; the multiplexer, wherein the first input end of the multiplexer is coupled to an output end of the on-chip clock to receive the internal clock signal from the on-chip clock, a second input end of the multiplexer is configured to receive the external clock signal, the multiplexer is configured to select to output the internal clock signal or the external clock signal based on the clock select signal from the test control logic, and an output end of the multiplexer is coupled to a first input end of a second clock switch;
an OR gate, wherein a first input end of the OR gate is configured to receive the memory test signal from the test control logic, a second input end of the OR gate is configured to receive the functional logic test signal from the test control logic, and an output end of the OR gate is coupled to a second input end of the second clock switch;
the first clock switch, wherein a first input end of the first clock switch is coupled to an output end of the on-chip clock to receive the internal clock signal from the on-chip clock, a second input end of the first clock switch is configured to receive a reverse signal from the memory test signal of the test control logic, and an output end of the first clock switch is configured to output the second clock signal for performing the second test; and the second clock switch, wherein the first input end of the second clock switch is coupled to an output end of the multiplexer, the second input end of the second clock switch is coupled to an output end of the OR gate, and the output end of the second clock switch is configured to output the first clock signal for performing the first test.

16. The chip of claim 10, wherein the operation module comprises a plurality of operation modules, and the controller is configured to divide more than two operation modules of the plurality of operation modules into one or more operation module groups according to a criterion, wherein performing the first test comprises testing the memory included in each operation module in the operation module group;

or performing the second test comprises testing the functional logic included in each operation module in the operation module group.

17. The chip of claim 16, wherein the criterion is that each operation module in the operation module group has the same attribution or functional logic.

18. An electronic device comprising:

one or more processors; and a memory for storing one or more programs which, when executed by the one or more processors, cause the electronic device to perform operations comprising:

receiving a test control signal indicating a test type of the operation module via a first pin of the chip;

performing, based on the test type, a first test of the operation module with a first test vector from outside of the chip via a second pin of the chip, or performing, based on the test type, a second test of the operation module with a second test vector from outside of the chip via the second pin of the chip, wherein the first test is a test performed for a memory included in the operation module, and the second test is a test performed for a functional logic included in the operation module.

\* \* \* \* \*